United States Patent
Huston et al.

(10) Patent No.: US 9,627,185 B2
(45) Date of Patent: Apr. 18, 2017

(54) METHODS AND APPARATUS FOR IN-SITU CLEANING OF A PROCESS CHAMBER

(71) Applicant: APPLIED MATERIALS, INC., Santa Clara, CA (US)

(72) Inventors: Joel M. Huston, San Jose, CA (US); Nicholas R. Denny, Santa Clara, CA (US); Chien-Teh Kao, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 149 days.

(21) Appl. No.: 14/557,671

(22) Filed: Dec. 2, 2014

(65) Prior Publication Data

US 2015/0155142 A1  Jun. 4, 2015

Related U.S. Application Data

(60) Provisional application No. 61/910,946, filed on Dec. 2, 2013.

(51) Int. Cl.
*B08B 7/00* (2006.01)
*H01J 37/32* (2006.01)

(52) U.S. Cl.
CPC .. *H01J 37/32862* (2013.01); *H01J 37/32449* (2013.01); *H01J 37/32834* (2013.01)

(58) Field of Classification Search
CPC ........... H01J 37/32862; H01J 37/32009; H01J 37/32458; H01J 2237/332; H01J 37/32834; H01J 37/3244
See application file for complete search history.

(56) References Cited

U.S. PATENT DOCUMENTS

| | | | |
|---|---|---|---|
| 5,558,717 A * | 9/1996 | Zhao | C23C 16/4401 118/715 |
| 5,756,400 A | 5/1998 | Ye et al. | |
| 5,827,435 A * | 10/1998 | Samukawa | H01J 37/32192 118/723 MW |
| 5,988,187 A | 11/1999 | Trussell et al. | |
| 6,060,397 A | 5/2000 | Seamons et al. | |

(Continued)

OTHER PUBLICATIONS

International Search Report and Written Opinion mailed Apr. 20, 2015 for PCT Application No. PCT/US2014/068124.

*Primary Examiner* — Binh X Tran
*Assistant Examiner* — David Cathey, Jr.
(74) *Attorney, Agent, or Firm* — Moser Taboada; Alan Taboada

(57) ABSTRACT

Methods and apparatus for in-situ cleaning of substrate processing chambers are provided herein. A substrate processing chamber may include a chamber body enclosing an inner volume; a chamber lid removably coupled to the chamber body and including a first flow channel fluidly coupled to the inner volume to selectively open or seal the inner volume to or from a first outlet; a chamber floor including a second flow channel fluidly coupled to the inner volume to selectively open or seal the inner volume to or from a first inlet; and a pump ring disposed in and in fluid communication with the inner volume, the pump ring comprising an upper chamber fluidly coupled to a lower chamber, and a second outlet fluidly coupled to the lower chamber to selectively open or seal the inner volume to or from the second outlet.

15 Claims, 2 Drawing Sheets

(56) References Cited

U.S. PATENT DOCUMENTS

| | | | |
|---|---|---|---|
| 2001/0020478 A1 | 9/2001 | Kojima et al. | |
| 2004/0115951 A1 | 6/2004 | Oshima | |
| 2007/0080141 A1* | 4/2007 | White | H01J 37/321 216/68 |
| 2008/0078744 A1* | 4/2008 | Wang | H01J 37/00 216/67 |
| 2008/0118663 A1* | 5/2008 | Choi | C23C 16/4404 427/579 |
| 2009/0114245 A1 | 5/2009 | Kojiri | |
| 2011/0312187 A1 | 12/2011 | Suzuki et al. | |

* cited by examiner

METHODS AND APPARATUS FOR IN-SITU CLEANING OF A PROCESS CHAMBER

CROSS-REFERENCE TO RELATED APPLICATIONS

This application claims benefit of U.S. provisional patent application Ser. No. 62/910,946, filed Dec. 2, 2013, which is herein incorporated by reference in its entirety.

FIELD

Embodiments of the present disclosure generally relate to substrate processing equipment.

BACKGROUND

Substrate processing systems, such as plasma reactors, may be used to deposit, etch, or form layers on a substrate supported within a processing chamber. The processes may result in undesirable deposits on portions of the processing chamber. Cleaning processes of the processing chamber are performed periodically cleaned to remove the undesirable deposits and waste products that may accumulate in the chamber. In some cleaning processes, sometimes referred to as in-situ cleaning, a cleaning gas is introduced to the chamber to clean the chamber and internal components and then exhausted to proper handling equipment.

The inventors have observed that some in-situ cleaning processes, the cleaning gases do not adequately clean the chamber surfaces, and may not contact some surfaces at all.

Thus, the inventors have provided herein apparatus and methods that may improve the performance of in-situ cleaning processes.

SUMMARY

Methods and apparatus for in-situ cleaning of substrate processing chambers are provided herein. In some embodiments, a substrate processing chamber includes a chamber body enclosing an inner volume; a chamber lid removably coupled to an upper portion of the chamber body, the chamber lid including a first flow channel fluidly coupled to the inner volume and adapted to selectively open the inner volume to a first outlet or to seal the inner volume from the first outlet; a chamber floor coupled to a lower portion of the chamber body, the chamber floor including a second flow channel fluidly coupled to the inner volume and adapted to selectively open the inner volume to a first inlet or seal the inner volume from the first inlet; and a pump ring disposed in the inner volume and in fluid communication with the inner volume, the pump ring comprising an upper chamber fluidly coupled to a lower chamber, and a second outlet fluidly coupled to the lower chamber and adapted to selectively open the inner volume to the second outlet or seal the inner volume from the second outlet, wherein the second flow channel, the inner volume, the pump ring, and the second outlet comprise a first flow path, and the second flow channel, the inner volume, the first flow channel, and the first outlet comprise a second flow path.

In some embodiments, a method of cleaning of a process chamber includes introducing a cleaning gas to an inner volume of a chamber body through a first flow channel through a chamber floor; providing a selectable first flow path for the cleaning gas comprising the first flow channel, an inner volume of the chamber, a pump ring within the chamber, and a first outlet; providing a selectable second flow path for the cleaning gas comprising the first flow channel, the inner volume of the chamber, and a second outlet through a chamber lid; and selecting a flow path to provide a cleaning gas flow path. In some embodiments, the method may further includes either or both of selecting the first flow path to provide a first cleaning gas flow path; and selecting the second flow path to provide a second cleaning gas flow path.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
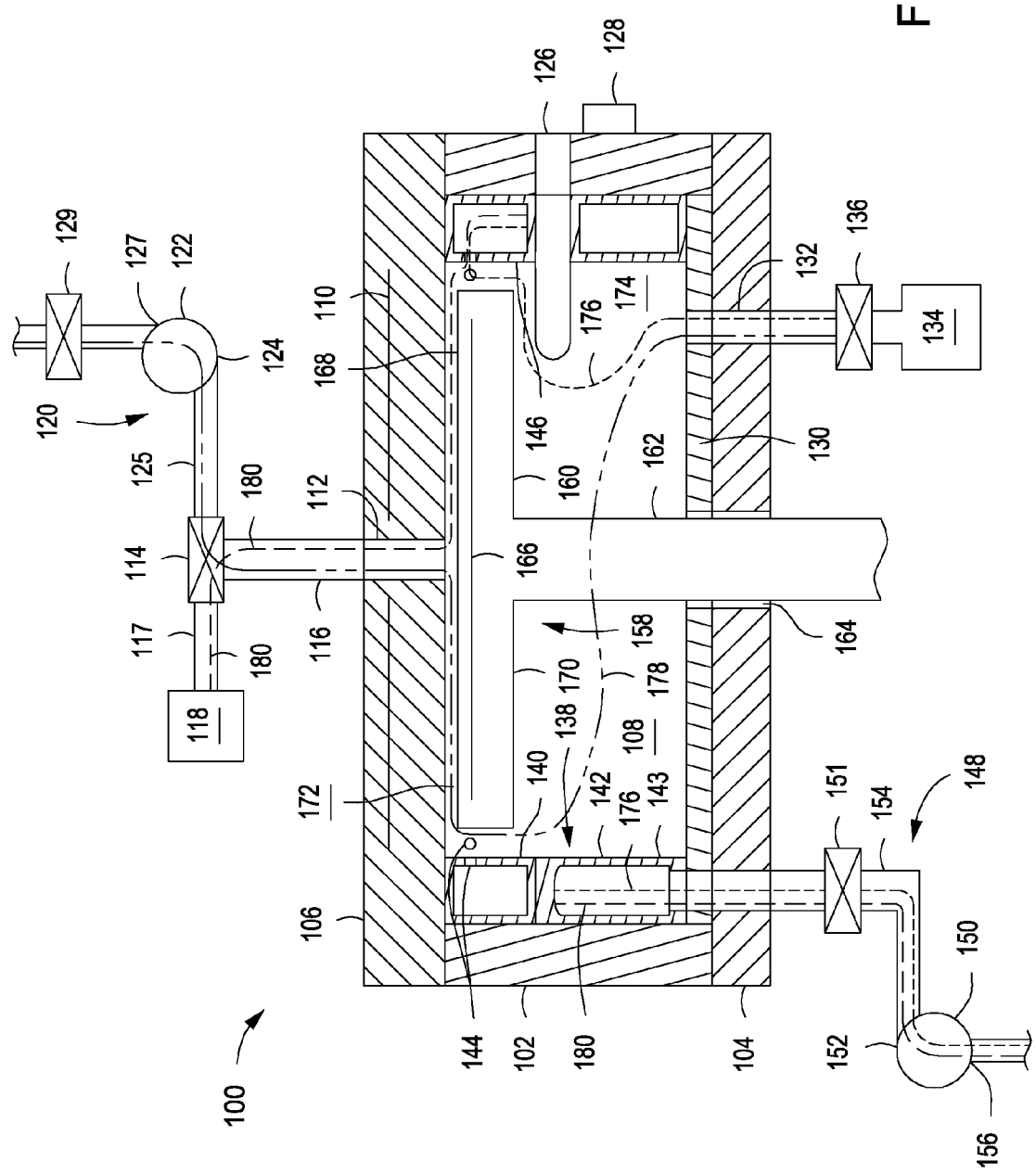
FIG. 1 depicts a schematic side sectional view of a processing chamber in accordance with embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus and methods for in-situ cleaning of substrate processing chambers and internal components are disclosed herein. The inventive apparatus may advantageously enhance the performance of in-situ cleaning processes by providing improved flow of the cleaning gases within the chamber.

For purposes of this disclosure, in-situ cleaning of substrate processing chambers is used to mean cleaning of the inner volume of the chamber, including components located within the inner volume of the chamber, without opening the chamber, for example by opening a lid. In-situ cleaning may be distinguished from other cleaning processes, such as wet cleaning, which requires opening of the chamber to gain physical access to the chamber volume and components.

FIG. 1 depicts a schematic side sectional view of a substrate processing chamber, chamber 100, in accordance with some embodiments of the present disclosure. The chamber 100 may be any chamber suitable for performing one or more substrate processes, for example but not limited to, deposition process such as chemical vapor deposition (CVD), atomic layer deposition (ALD), or the like. The reactor may be a standalone reactor or a part of a cluster tool, such as one of the CENTURA®, PRODUCER®, or ENDURA® cluster tools available from Applied Materials, Inc. of Santa Clara, Calif.

In some embodiments, the chamber 100 may generally include a chamber wall 102, a chamber floor 104, and a chamber lid 106 enclosing an inner volume 108. Components of the chamber 100, including the chamber wall 102, the chamber floor 104, and the chamber lid 106, may be formed from any process compatible material, for example aluminum or stainless steel.

The chamber lid 106 is removably coupled to an upper portion of the chamber wall 102 using any coupling element or elements (not shown). In some embodiments, the chamber lid 106 may include one or more heaters 110 to facilitate temperature control of the chamber lid 106. The inventors have noted that a heated chamber lid 106 may facilitate cleaning in some in-situ cleaning operations. The heater 110 may facilitate heating an inner surface of the chamber lid 106 to a cleaning temperature between about 100° C. and about 300° C., for example about 200° C.

The chamber lid 106 includes a flow channel, first flow channel 112, which extends through the chamber lid 106 and is fluidly coupled to the inner volume 108. The first flow channel 112 is fluidly coupled to a valve 114, for example by a conduit 116, to selectively open the inner volume 108 to a first outlet 125.

The valve 114 selectively opens the inner volume 108 of the chamber 100 to a first exhaust 120 via first outlet 125. In some embodiments, the valve 114 optionally may also be fluidly coupled to a first gas inlet 117 to supply one or more sources of gas, such as first gas supply 118 (one shown) to the inner volume 108. The gas supply may provide a flow of a process gas to the inner volume 108. In some embodiments, the valve 114 is configured to open the inner volume 108 to a first gas supply 118, for example a cleaning gas or a process gas, via first gas inlet 117 or to a first exhaust 120 via first outlet 125.

The valve 114 functions to selectively open the inner volume 108 to the first gas inlet 117 (if provided) and seal the inner volume 108 from the first outlet 125, or to open the inner volume 108 to the first outlet 125 and seal the inner volume 108 from the first gas inlet 117, or may seal the inner volume 108 from the first gas inlet 117 and from the first outlet 125.

The first exhaust 120 may include a first exhaust pump, first pump 122, coupled at a suction side 124 to the valve 114 via the first outlet 125 and coupled at a pressure side 127 to suitable exhaust handling equipment (not shown) via a valve 129.

The chamber wall 102 laterally bounds the inner volume 108 of the chamber 100 and may include an opening 126 to allow access to the inner volume, for example to provide a substrate to, and removed a substrate from, the inner volume 108. A substrate transport mechanism (not shown), such as a robot, may be provided to transfer a substrate to and from the inner volume 108 through the opening 126. The opening 126 may be selectively sealed via a slit valve 128, or other mechanism for selectively providing access to the inner volume 108 of the chamber 100 through the opening 126.

A lower portion of the chamber wall 102 is supported by, and coupled to, the chamber floor 104. A heater plate 130 may optionally be included in the chamber 100 and be supported by the chamber floor 104 to facilitate temperature control of the chamber floor 104. One or more second flow channels 132 (one shown) may be provided through the chamber floor 104 and the heater plate 130 to fluidly couple with the inner volume 108. In some embodiments, the second flow channel 132 fluidly couples the inner volume 108 to the second gas supply 134 through a valve 136. In embodiments including more than one second flow channel 132, each flow channel may be controlled by a separate valve 136 or one valve 136 may be provided for all of the second flow channels 132. The second flow channel 132 may be adapted to provide a second inlet of one or more cleaning gases into the inner volume 108. In embodiments with more than one flow channel, the more than one second flow channels 132 may be positioned in any location through the chamber floor 104 to provide a desired flow of cleaning gases into the inner volume 108.

A pump ring 138 is provided adjacent to the chamber walls 102 facing the inner volume 108. The pump ring 138 comprises an upper chamber 140 fluidly coupled to a lower chamber 142, for example though holes or passages (not shown). The upper chamber 140 is fluidly coupled to the inner volume 108 through passages 144 through the inner volume facing surface of the upper chamber wall 146. The lower chamber 142 is fluidly coupled via a second outlet 154 to a second exhaust 148 which may provide an exhaust path from the pump ring 138. The second outlet 154 may be coupled to the suction side 152 of a second exhaust pump, second pump 150, and the second pump 150 coupled at a pressure side 156 to suitable exhaust handling equipment (not shown). In some embodiments, the second outlet 154 may be a common outlet used for exhausting process gases from the inner volume 108.

In some embodiments, the heater plate 130 may facilitate heating of the inner facing wall 143 of the pump ring 138. The inventors have noted that a heated inner facing wall 143 and chamber floor 104 may facilitate cleaning in some in-situ cleaning operations. The heater plate 130 may facilitate heating the inner facing wall 143 and the chamber floor 104 to a cleaning temperature between about 100° C. to about 300° C., for example about 200° C.

In some embodiments, the first pump 122 and the second pump 150 are the same pump. For example, in some embodiments, the first outlet 125 may be fluidly coupled to the suction side 152 of the second pump 150 via a valve (not shown) to selectively fluidly couple the first outlet 125 to the second pump 150, or the second outlet 154 to the second pump 150, or both the first outlet 125 and the second outlet 154 to the second pump 150.

In some embodiments a substrate support 158 is disposed within the inner volume 108 comprising a plate 160 supported by a shaft 162 coupled to a bottom surface 170 for displacement between at least a raised, processing position (as shown) and a lower position, for example for loading or unloading a substrate on a top surface 168 of the plate 160. The plate 160 may comprises a heater element 166 to facilitate temperature control of the plate 160. A passage 164 may be formed through the chamber floor 104 and the heater plate 130 to accommodate the shaft 162.

The plate 160 separates the inner volume 108 into a processing region 172 between the top surface 168 of the plate 160 and the chamber lid 106 and a non-processing region 174 between the top surface 168 and the chamber floor 104. The plate 160 may be disposed at any vertical position within the inner volume 108.

In some embodiments, a first flow path may be formed comprising the second flow channel 132, the inner volume 108, the pump ring 138, and the second outlet 154. The first flow path flows from the non-processing region 174 to the pump ring 138 through the passages 144 located in a region of the upper chamber wall 146 and exits the chamber 100 through the heater plate 130 and the chamber floor 104 via second outlet 154 and valve 151.

In some embodiments, a second flow path may be formed comprising the second flow channel 132, the inner volume 108, the first flow channel 112, the valve 114, and the first outlet 125.

The inventors have observed that some conventional chambers configured for in-situ cleaning of the interior chamber components (i.e., components within the inner volume 108 which may include for example, the substrate support, the pump ring, and the chamber walls) provide a cleaning gas or gases through the chamber lid. The cleaning gases have been observed to follow the same, or a similar, flow path as the process gases. In some cases, that includes the processing region, the top surface of the substrate support plate and the pump ring. However, some process gases or process byproducts migrate to the non-processing region and accumulate over a number of process cycles. The process gases and process byproducts can enter the processing region under some conditions causing contamination of the processing region and the substrate undergoing processing. Accordingly, the inventors present herein an apparatus and method that may provide a more thorough in-situ cleaning of chamber components in which the non-processing region can be cleaned as well as cleaning of the processing region.

Figure 2:
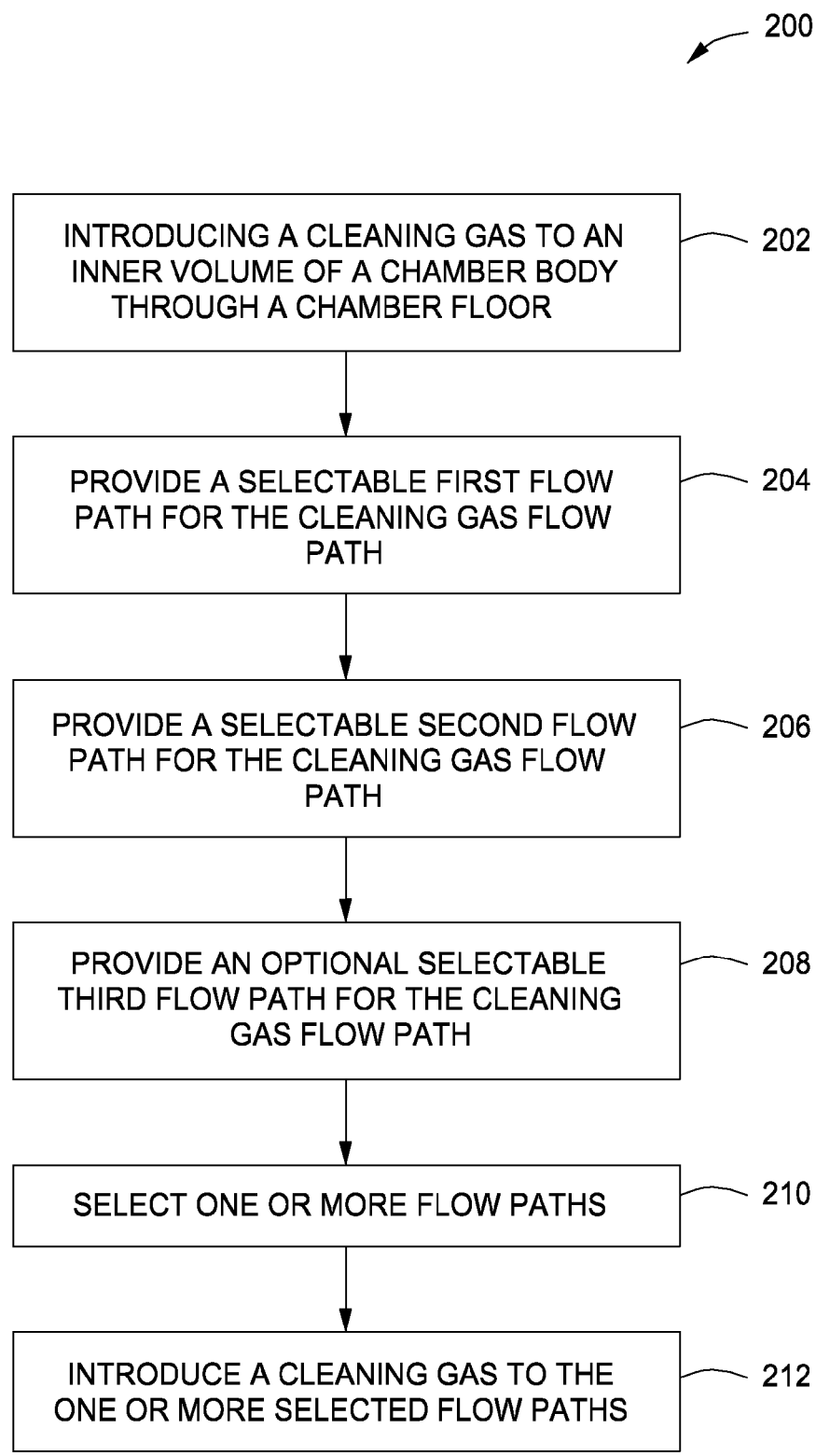
FIG. 2 is a flow diagram of a method for in-situ cleaning of a process chamber in accordance with some embodiments of the present disclosure.

FIG. 2 is a flow diagram outlining a method 200 of in-situ cleaning of a process chamber in accordance with embodiments of the present disclosure. The method generally begins at 202 where a cleaning gas is introduced to an inner volume 108 of a chamber 100 through a flow channel (second flow channel 132) through the chamber floor 104. One or more flow channels may be provided through the chamber floor 104 and the heater plate 130 (if present) and positioned to provide a desired flow path of one or more cleaning gases through the inner volume 108. In some embodiments, three second flow channels 132 may be provided radially offset from a center of the chamber and angularly displace about 120 degrees apart. Other configurations of second flow channels 132 are anticipated.

At 204, a selectable first flow path 176 for the cleaning gas is provided. The first flow path 176 comprises the second flow channel 132, the inner volume 108 of the chamber 100, the pump ring 138, and the second outlet 154. The first flow path 176 includes a portion of the inner volume 108 below the top surface 168 of the plate 160, and bounded by the pump ring 138 and the chamber floor 104 (or the heater plate 130 if present). This region may appropriately be referred to as a non-processing region because substrate processing is not carried out in this portion of the inner volume 108. However, contaminants may be formed in the non-processing region believed to be caused by migration of process gases or process byproducts into the non-processing region. In-situ cleaning of chambers has been ineffective in removing contamination in the non-processing region. The purposeful flow of cleaning gas into the non-processing region of the chamber 100 may advantageously provide sufficient cleaning gas to provide an effective in-situ cleaning process.

At 206, a selectable second flow path 178 for the cleaning gas is provided. The second flow path 178 comprises the second flow channel 132, the inner volume 108, the first flow channel 112, and the first outlet 125. The second flow path 178 includes the non-processing region of the chamber as well as the processing region bounded by the top surface 168 of the plate 160, the chamber lid 106 and the pump ring 138. The processing region is appropriately named because the processing region includes the area in which a substrate supported by the top surface 168 of the plate 160 is processed.

At 208, an optional selectable third flow path 180 for a gas, for example a cleaning gas from the first gas supply 118, is provided.

At 210, a selection is made between one or more of the first flow path 176, the second flow path 178, and the third flow path 180 to provide a cleaning gas flow path, that is a flow path available to flow a cleaning gas from a cleaning gas supply through the inner volume 108 of the chamber 100. The flow paths selected may be selected sequentially in any order to flow a gas or a cleaning gas through the inner volume 108. Under certain conditions, some of the flow paths may be concurrently selected as discussed in greater detail below.

As illustrated in FIG. 1 and described above, a gas from the first gas supply 118 may be supplied to the inner volume 108 of the chamber 100 through the chamber lid 106 or a second gas supply 134 may be supplied through the chamber floor 104 into inner volume 108.

The third flow path 180 is provided for a gas provided to the inner volume 108 through the chamber lid 106. The third flow path includes the processing region 172, the pump ring 138, the valve 151, and the second outlet 154.

Two flow paths are provided for a gas supplied to the inner volume 108 through the chamber floor 104. The first flow path 176 includes the non-processing region 174 of the inner volume 108, the pump ring 138, valve 151, and the second outlet 154. Opening the valve 151 may make the first flow path available to flow a gas, for example a cleaning gas supplied from the second gas supply 134, through the chamber components and exit the chamber, for example through the second outlet 154. To facilitate the flow, a pump, second pump 150, may be provided to encourage the flow thorough the chamber.

The second flow path 178 includes the non-processing region 174, the processing region 172, the first flow channel 112, the valve 114 and the first outlet 125. Positioning the valve 114 in a position to open the inner volume 108 to the first outlet 125 makes the second flow path 178 available to flow a gas, for example a cleaning gas supplied from the second gas supply 134, through the chamber components and exit the chamber, for example through the first outlet 125. To facilitate the flow, a pump, first pump 122, may be provided to encourage the flow thorough the chamber 100.

The selection of the first flow path 176 or the second flow path 178 is independent of the condition (available or unavailable) of the other flow path, that is, one flow path can be selected and made available regardless of the availability of the other flow path. For example, the first flow path 176 may be made available while the second flow path 178 is available or unavailable. The same is true for the first flow path if the second flow path 178 is made available.

The selection of the third flow path 180, if provided, can be selected and available separately or concurrently with the first flow path 176. If the first flow path 176 and the third flow path 180 are available concurrently, the two flow paths would utilize the pump ring 138 and the second outlet 154 to remove the gas flowed into the inner volume 108.

At 212, a gas, for example a cleaning gas, is introduced to the one or more selected flow paths to provide in-situ cleaning of the inner volume 108 of the chamber 100. The first flow path 176 exposes at least some of the boundary surfaces of the non-processing region 174 to the gas flowed in the first flow path 176. The second flow path 178 exposes at least some of the boundary surfaces of the non-processing region 174 and at least some of the processing region 172 to the gas flowed in the second flow path 178.

The inventors have noted a number of benefits of the disclosed in-situ cleaning method. By providing a cleaning gas to the non-processing region 174 of the chamber 100, surfaces that can be contaminated with process gases or process byproducts are contacted by the cleaning gas and may be at least partially cleaned. This reduces the potential for contaminants breaking free from the non-processing region 174 and entering the processing region 172 and potentially contamination a substrate being processed. The disclose method may reduce the period of time the chamber 100 is placed out of service (sometimes called down-time) for cleaning. The disclosed in-situ cleaning process may take place at or near the processing temperature of the chamber, reducing or eliminating the cooling time clean the chamber 100 and reheating time to return the chamber 100 to service. These and other benefits may be realized in practicing the disclosed inventive method.

While the foregoing is directed to embodiments of the present disclosure, other and further embodiments of the disclosure may be devised without departing from the basic scope thereof.

The invention claimed is:

1. A substrate processing chamber, comprising:
a chamber body enclosing an inner volume;
a chamber lid removably coupled to an upper portion of the chamber body, the chamber lid including a first flow channel fluidly coupled to the inner volume and adapted to selectively open the inner volume to a first outlet or to seal the inner volume from the first outlet;
a chamber floor coupled to a lower portion of the chamber body, the chamber floor including a second flow channel fluidly coupled to the inner volume and adapted to selectively open the inner volume to a first inlet or seal the inner volume from the first inlet; and
a pump ring disposed in the inner volume and in fluid communication with the inner volume, the pump ring comprising an upper chamber fluidly coupled to a lower chamber, and a second outlet fluidly coupled to the lower chamber and adapted to selectively open the inner volume to the second outlet or seal the inner volume from the second outlet, wherein the second flow channel, the inner volume, the pump ring, and the second outlet comprise a first flow path, and the second flow channel, the inner volume, the first flow channel, and the first outlet comprise a second flow path.

2. The chamber of claim 1, wherein the first flow channel is further adapted to selectively open the inner volume to a second inlet or to seal the inner volume from the second inlet.

3. The chamber of claim 2, further comprising:
a second gas supply coupled to the second inlet to provide at least one of a process gas or a cleaning gas.

4. The chamber of claim 1, further comprising:
a substrate support disposed in the inner volume, the substrate support comprising a plate having a top surface, the plate supported by a shaft, wherein the plate separates the inner volume into a processing region between the top surface and the chamber lid and a non-processing region between the top surface and the chamber floor.

5. The chamber of claim 4, wherein a portion of the first flow path comprises a portion of the non-processing region.

6. The chamber of claim 4, wherein a portion of the second flow path comprises a portion of the non-processing region.

7. The chamber of claim 4, wherein a portion of the second flow path includes the processing region.

8. The chamber of claim 1, further comprising a first gas supply fluidly coupled to the first flow channel through a valve such that the inner volume may be selectively opened to the first gas supply and closed to the first outlet, opened to the first outlet and closed to the first gas supply, or closed to both the first gas supply and the first outlet.

9. The chamber of claim 1, wherein the first flow path and the second flow path are selectable to be concurrently open, sequentially open, or closed.

10. The chamber of claim 1, further comprising:
a valve fluidly coupled to the first flow channel adapted to selectively open the inner volume to the first outlet or to a first gas inlet.

11. The chamber of claim 10, wherein a third flow path includes a processing region, the pump ring, the valve, and the second outlet.

12. The chamber of claim 1, further comprising a heater disposed in the chamber lid to heat an inner surface of the chamber lid to a cleaning temperature of between about 100° C. and about 300° C.

13. The chamber of claim 1, further comprising a heater plate disposed on the chamber floor to heat the chamber floor and an inner facing surface of the pump ring to a cleaning temperature of between about 100° C. and about 300° C.

14. The chamber of claim 1, further comprising one or more pumps fluidly coupled to one or more of the first outlet and the second outlet to facilitate a flow through the chamber.

15. A substrate processing chamber, comprising:
a chamber body enclosing an inner volume;
a chamber lid removably coupled to an upper portion of the chamber body, the chamber lid including a first flow channel fluidly coupled to the inner volume and adapted to selectively open the inner volume to a first outlet or to seal the inner volume from the first outlet;
a chamber floor coupled to a lower portion of the chamber body, the chamber floor including a second flow channel fluidly coupled to the inner volume and adapted to selectively open the inner volume to a first inlet or seal the inner volume from the first inlet; and
a pump ring disposed in the inner volume and in fluid communication with the inner volume, the pump ring comprising an upper chamber fluidly coupled to a lower chamber, and a second outlet fluidly coupled to the lower chamber and adapted to selectively open the inner volume to the second outlet or seal the inner volume from the second outlet, wherein the second flow channel, the inner volume, the pump ring, and the second outlet comprise a first flow path, and the second flow channel, the inner volume, the first flow channel, and the first outlet comprise a second flow path.

* * * * *